(12) United States Patent
Ogimoto et al.

(10) Patent No.: US 8,709,617 B2
(45) Date of Patent: *Apr. 29, 2014

(54) MAGNETIC MEMORY ELEMENT, DRIVING METHOD FOR SAME, AND NONVOLATILE STORAGE DEVICE

(75) Inventors: Yasushi Ogimoto, Higashiyamato (JP); Haruo Kawakami, Miura (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 467 days.

This patent is subject to a terminal disclaimer.

(21) Appl. No.: 13/001,343

(22) PCT Filed: Sep. 5, 2008

(86) PCT No.: PCT/JP2008/066075
§ 371 (c)(1),
(2), (4) Date: Mar. 21, 2011

(87) PCT Pub. No.: WO2009/157101
PCT Pub. Date: Dec. 30, 2009

(65) Prior Publication Data
US 2011/0188297 A1 Aug. 4, 2011

(30) Foreign Application Priority Data
Jun. 25, 2008 (JP) ................. 2008-165989

(51) Int. Cl.
*H01F 10/08* (2006.01)
*H01L 43/08* (2006.01)
*H01L 43/12* (2006.01)

(52) U.S. Cl.
USPC ........ 428/811; 428/811.5; 257/421; 365/158; 365/171; 365/172; 365/173; 360/324.12

(58) Field of Classification Search
None
See application file for complete search history.

(56) References Cited

U.S. PATENT DOCUMENTS 6,654,278 B1   11/2003  Engel et al.
7,095,646 B2 *  8/2006  Slaughter et al. ............. 365/158
7,397,071 B2 *  7/2008  Sugahara et al. ............. 257/213

(Continued)

FOREIGN PATENT DOCUMENTS

EP    2306540 A1    4/2011
JP    2004-179483 A    6/2004

(Continued)

OTHER PUBLICATIONS

D.D. Djayaprawira et al, "230% room-temperature magnetoresistance in CoFeB/MgO/CoFeB magnetic tunnel junctions", Applied Physics Letters, vol. 86, 092502, 2005.

(Continued)

*Primary Examiner* — Kevin Bernatz
(74) *Attorney, Agent, or Firm* — Rabin & Berdo, P.C.

(57) ABSTRACT

In accordance with one aspect of the invention, a magnetic memory element records information in a spin valve structure having a free layer, a pinning layer, and a nonmagnetic layer sandwiched therebetween. The magnetic memory element further has, on the free layer, a separate nonmagnetic layer and a magnetic change layer having magnetic characteristics which change according to temperature. Multiple cutouts, including one cutout with a different shape, are provided in a peripheral portion of the spin valve structure. A method of driving the magnetic memory element is characterized in that information is recorded by applying unipolar electric pulses.

20 Claims, 5 Drawing Sheets

(56) References Cited

U.S. PATENT DOCUMENTS

| | | | |
|---|---|---|---|
| 7,592,189 B2* | 9/2009 | Iwata et al. | 438/3 |
| 7,599,156 B2* | 10/2009 | Kishi et al. | 360/324.11 |
| 7,929,342 B2* | 4/2011 | Numata et al. | 365/171 |
| 8,009,465 B2* | 8/2011 | Nakayama et al. | 365/158 |
| 8,013,407 B2* | 9/2011 | Takenaga et al. | 257/421 |
| 8,269,295 B2* | 9/2012 | Takenaga et al. | 257/421 |
| 8,362,581 B2* | 1/2013 | Takenaga et al. | 257/421 |
| 8,427,866 B2* | 4/2013 | Takenaga et al. | 365/171 |
| 2002/0130339 A1* | 9/2002 | Kishi et al. | 257/295 |
| 2003/0169147 A1* | 9/2003 | Higo | 338/32 R |
| 2003/0185050 A1* | 10/2003 | Kishi et al. | 365/173 |
| 2004/0021539 A1* | 2/2004 | Bland et al. | 335/302 |
| 2004/0105305 A1 | 6/2004 | Hayakawa | |
| 2005/0078417 A1* | 4/2005 | Kishi et al. | 360/324.2 |
| 2005/0184839 A1* | 8/2005 | Nguyen et al. | 335/173 |
| 2005/0226040 A1* | 10/2005 | Zhu et al. | 365/158 |
| 2006/0092696 A1 | 5/2006 | Bessho | |
| 2007/0247901 A1 | 10/2007 | Akinaga et al. | |
| 2008/0030906 A1* | 2/2008 | Sato | 360/324.2 |
| 2008/0191295 A1* | 8/2008 | Ranjan et al. | 257/421 |
| 2009/0180311 A1 | 7/2009 | Ono et al. | |
| 2011/0012215 A1* | 1/2011 | Nguyen et al. | 257/421 |
| 2011/0086440 A1* | 4/2011 | Boone et al. | 438/3 |

FOREIGN PATENT DOCUMENTS

| | | |
|---|---|---|
| JP | 2004-363350 A | 12/2004 |
| JP | 2005-535115 T | 11/2005 |
| JP | 2006-128579 A | 5/2006 |
| WO | WO-2007/105358 A1 | 9/2007 |

OTHER PUBLICATIONS

J. Hayakawa et al, "Current-induced magnetization switching in MgO barrier based magnetic tunnel junctions with CoFeB/Ru/CoFeB synthetic ferrimagnetic freelayer", Japanese Journal of Applied Physics, vol. 45, L1057-L1060, 2006.

* cited by examiner

MAGNETIC MEMORY ELEMENT, DRIVING METHOD FOR SAME, AND NONVOLATILE STORAGE DEVICE

BACKGROUND

This invention relates to a magnetic memory element capable of storing information by electrical means, a method of driving such an element, and a nonvolatile storage device.

BACKGROUND ART

In recent years, there have been remarkable increases in the storage capacity of nonvolatile semiconductor storage devices, of which flash memory is representative, and the release of products with a capacity of approximately 32 Gbytes has been announced. The commercial value of nonvolatile semiconductor storage devices is increasing, in particular as USB memory devices and as storage for portable telephones; and with application as storage in portable music players which exploit the intrinsic superiority of solid-state memory such as shock- and vibration-resistance, high reliability, and low power consumption, such devices are becoming the mainstream of storage for portable audio and video applications, and of transportable commercial storage.

Further, separately from the above storage-related applications, energetic research is also in progress to make nonvolatile the DRAM currently being used as main memory in information equipment, aiming at realization of so-called "instant-on computers", which are computers which start instantaneously when used and the power consumption during standby of which is close to zero as much as possible. To this end, memory which satisfies requirements for (1) switching time (<50 ns) and (2) number of rewrite cycles (>$10^{16}$), which are demanded for use as DRAM, and in addition which is nonvolatile, is thought to be necessary.

As candidates for such next-generation nonvolatile semiconductor storage devices, research and development is being conducted on nonvolatile memory elements based on the unique principles of ferroelectric memory (FeRAM), magnetic memory (MRAM), phase-change memory (PRAM) and similar, but it is thought that only MRAM is a candidate satisfying the above specifications for DRAM replacement. However, the number of rewrite cycles given as the above specification (>$10^{16}$) assumes the number of accesses in 30 ns over 10 years, and in the case of nonvolatile memory a refresh cycle is unnecessary, so that this number of cycles is not needed. MRAM is already at the trial manufacture level, and as a number of rewrite cycles of $10^{12}$ or above has been achieved, and switching times are fast (<10 ns), this is regarded as a most promising technology compared with other candidates for nonvolatile storage devices.

The most serious problems with MRAM are the cell area and the per-bit cost. Currently commercialized MRAM with small capacities of approximately 4 Mbits are current magnetic-field rewrite type devices, with a large cell area of 20 to 30 $F^2$ (where F is the minimum feature size of the manufacturing process) or greater, and currently are not viable as a technology to replace DRAM. However, two breakthroughs are now changing the situation. One is MTJs (magnetic tunneling junctions) using MgO tunnel barrier film, for which a magnetoresistive ratio of 200% or higher can easily be obtained (D. D. Djayaprawira et al, "230% room-temperature magnetoresistance in CoFeB/MgO/CoFeB magnetic tunnel junctions", Applied Physics Letters, vol. 86, 092502, 2005, hereinafter "Djayaprawira"). The other is the current-induced magnetization switching method. This technology makes it possible to avoid increases in magnetic reversal fields in minute cells, which had been a critical problem for current magnetic-field rewrite methods, and conversely, enables reduction of the write energy through scaling. By means of this current-induced magnetization switching method, if a transistor is used as a memory cell selection switching element, a configuration is possible which uses one transistor per MTJ (one transistor-one MTJ), which is also ideal from the standpoint of cell area, and is inferred to result in 6 to 8 $F^2$, comparable to DRAMs (see J. Hayakawa et al, "Current-induced Magnetization Switching in MgO Barrier Based Magnetic Tunnel Junctions with CoFeB/Ru/CoFeB Synthetic Ferrimagnetic Freelayer", Japanese Journal of Applied Physics, vol. 45, L1057-L1060, 2006, hereinafter "Hayakawa"). Further, aiming at small cell sizes (approximately 4 $F^2$) comparable to flash memory, a configuration using one diode per MTJ (one diode-one MTJ) has also been proposed in Japanese Patent Laid-open No. 2004-179483 (hereinafter the "'483 patent"). If this one diode-one MTJ configuration can be used, crosspoint type memory can be realized, and the above-described small cell areas can be achieved. And it has been proposed that, in elements provided with a driving layer in which the magnetization direction is substantially fixed in the layering direction, by ensuring that the current has only one polarity and reducing the number of transistor types from two to one, the circuit can be further simplified, and the cell size can be reduced to be equal to that of DRAM in a one transistor-one MTJ circuit (the '579 patent).

However, in the one diode-one MTJ proposal (Hayakawa), switching is performed by a forward bias and a leakage current under a reverse bias through a diode. That is, in this proposal the principle of performing switching through the polarity of the current remains unchanged, and switching is performed by a forward bias and a leakage current under a reverse bias. However, in the prior art a diode is formed in order to perform write, erase, and read operations without disturbing the MTJ selection; the above proposal, based on the principle of switching operation using a leakage current under a reverse bias, conflicts with this principle. That is, when under a reverse bias, similarly to memory addressed by a simple matrix type circuit without element selection switches, the problem of disturbance (crosstalk) occurs, so that highly integrated elements cannot be realized. Thus in order to realize a one diode-one MTJ crosspoint type memory with a smallest cell area of 4 $F^2$, the current-induced magnetization switching method which until now has employed switching based on the current polarity as the operation principle itself becomes the essential issue. Further, the one transistor-one MTJ circuit employing elements with a driving layer provided in which the magnetization direction is fixed substantially in the layering direction, described in Japanese Patent Laid-open No. 2006-128579 (hereinafter the "'579 patent"), is a method in which spin precession is induced by spin injection from the driving layer into a free layer; by changing the time of flow in the storage element, data "0" and "1" are recorded. However, this method, which entails control of the time for current supply, which is determined by the period of the spin precession, is expected to be prone to errors due to variation in element shapes and variation in pulse widths, and realization will be difficult.

BRIEF SUMMARY

This invention was devised in light of the above problems, and has as an object the provision of a magnetic memory element capable of switching by unipolar electrical pulses, and a nonvolatile storage device which, by using a method of driving such an element, realizes a cell area of 4 F², surpassing the cell area of DRAM and comparable to that of flash memory, and which through multivalue recording realizes high densities equal to or greater than this.

The inventors of the present application revisited the principle of methods using spin precession, and by examining the above problems, arrived at the invention, described below, of a magnetic memory element, a method of driving such an element, and a nonvolatile storage device.

That is, in order to resolve the above problems, a magnetic memory element of this invention is provided comprising a spin valve structure, having a free layer, a pinning layer and a nonmagnetic layer sandwiched between the free layer and the pinning layer; a separate nonmagnetic layer, arranged so as to sandwich the free layer together with the nonmagnetic layer; and a magnetic change layer, arranged so as to sandwich the separate nonmagnetic layer together with the free layer, and having magnetic characteristics which change according to temperature, the magnetic memory element being characterized in that a plurality of cutouts, including one cutout with a different shape, are provided in a peripheral portion of the spin valve structure. Here, a spin valve structure is a structure comprising a magnetic layer (pinning layer)/nonmagnetic layer/magnetic layer (free layer), designed such that the magnetization arrangement of the pinning layer is harder to change than that of the free layer. In the case of switching by a magnetic field, methods are well known in which, for example, an antiferromagnetic layer is arranged in proximity to the pinning layer, and the coercive force of the pinning layer is increased through the exchange coupling with the antiferromagnetic layer. By this means, when for example an external magnetic field of a certain magnitude is applied, the magnetization arrangement in the pinning layer is not changed, and the angle made by the magnetization arrangement in the free layer with the magnetization arrangement in the pinning layer undergoes a relative change. In a magnetic memory element of this invention, the phenomenon in which the resistance value changes according to this change (the phenomenon in which the resistance is lowest for parallel arrangements, and the resistance is highest for antiparallel arrangements) is utilized. Further, the nonmagnetic layer serves to cut off the magnetic coupling between the ferromagnetic layers (between the pinning layer and the free layer), and operates as a giant magnetoresistance (GMR) element when metal is used, but operates as a tunneling magnetoresistance (TMR) element when an insulator is used. It should be noted that when a current is used to perform switching, the pinning layer need not have a large coercive force (Hc) or magnetic anisotropy (Ku); rather, a sufficiently large magnetization (Ms), and difficulty of occurrence of spin precessional movement, are important. Cutouts may be formed not only in the spin valve structure, but simultaneously in the magnetic change layer and in the nonmagnetic layer in contact therewith. In the entirety of this Specification, the virgule symbol (/) between layers indicates that the layers are layered in the given order.

By means of a magnetic memory element with the above characteristics, a magnetic field generated from the magnetic change layer by a driving method described below, which is a magnetic field comprising an in-plane component parallel to or antiparallel to a cutout and a perpendicular component, acts on the free layer. At this time, due to the fact that there is a cutout with a different shape, a vortex portion is generated in the magnetization of the free layer by spin injection from the pinning layer, and the magnetization of the free layer can be switched.

Further, a magnetic memory element of this invention is characterized in that a direction of extension of the cutout with a different shape and an orientation of magnetization of the pinning layer are orthogonal to each other.

By means of the above characteristic, during reading, three values can be allocated, taking as different storage states the three states of being parallel to the pinning layer (minimum resistance value RL), being perpendicular to the pinning layer (intermediate resistance value RM), and being antiparallel to the pinning layer (maximum resistance value RH), so that multivalue recording is made possible (when four cutouts are formed at 90° intervals).

Further, a magnetic memory element of this invention is characterized in that the magnetic change layer comprises an amorphous rare earth-transition metal alloy thin film.

And, a magnetic memory element of this invention is characterized in that, at a certain temperature, the magnetic change layer exhibits magnetization oriented in a film plane and along the direction of extension of the cutout with a different shape, and in that a component perpendicular to the film plane appears in the magnetization by raising the temperature from this temperature.

Also, a magnetic memory element of this invention is characterized in that the magnetic change layer is an N-type ferrimagnet having a magnetic compensation temperature $T_{comp}$ in a memory holding operation temperature range of the magnetic memory element.

By means of a configuration with the above characteristics, a spin valve element can easily be manufactured regardless of the foundation, and in the process of rising temperature due to application of an electric pulse, a magnetic field can be applied in an oblique direction to the free layer. And, if the magnetic compensation temperature is near the memory holding operation temperature, when an electric pulse is not applied (in the case of a memory holding operation), data stability can be preserved without applying an unnecessary magnetic field to the free layer. As such a material, GdFeCo and TbFeCo, in which the magnetization changes from perpendicular magnetization to in-plane magnetization with rising temperature, are suitable. An N-type ferrimagnet has two types of antiparallel magnetizations A and B (for example, in the case of TbFeCo the two types are the Tb magnetization and the FeCo magnetization); because the temperature dependences thereof are different, in these materials there exists a magnetic compensation temperature $T_{comp}$ at which the apparent magnetization (A-B) vanishes.

Further, a method of driving a magnetic memory element of this invention is a method of driving any of the above magnetic memory elements, and is characterized in that information is recorded by applying unipolar electric pulses.

By means of a configuration with the above characteristics, a magnetic field can be applied to the free layer using electric pulses for current-induced magnetization switching only, without providing separate wiring, inducing a rotational magnetization (vortex) mode by spin injection from the pinning layer, so that switching of the free layer is possible.

Further, a method of driving a magnetic memory element of this invention is characterized in that unipolar electric pulses used in storing information comprise two or more pulses of different heights, and in that different information is recorded by changing the second pulse height.

By means of a configuration with the above characteristics, recorded contents can be rewritten using pulse heights (voltage values or current values) rather than the time of current supply to the element, so that the control method becomes easy, and error-free recording of information is possible.

Further, a method of driving a magnetic memory element of this invention is characterized in that, regardless of a recording state of the magnetic memory element, recorded multivalue information and types of unipolar electric pulses to record the multivalue information are in a one-to-one correspondence.

By means of a configuration with the above characteristics, an operation to read the stored contents prior to writing is made unnecessary, and multivalue information can be recorded directly without changing the write pulse according to the stored contents, so that high-speed multivalue recording is realized.

A nonvolatile storage device of this invention is characterized in comprising any of the above magnetic memory elements, a rectifying element connected in series to the magnetic memory element, information rewrite means employing any of the driving methods described above, and means for reading stored information from a current quantity flowing through the magnetic memory element.

By means of a nonvolatile storage device with the above characteristics, switching by unipolar electric pulses is made possible, so that memory cells comprising one diode and one MTJ can be configured, and a cell area of 4 $F^2$, comparable to that of flash memory can be achieved, as well as high densities equal to or above those of flash memory through multivalue recording. Hence nonvolatile storage devices providing fast operation and a high number of rewrite cycles can be integrated at high density on a substrate 1, so that high-performance nonvolatile storage devices can be provided at low cost.

As explained above, a nonvolatile storage device comprising a magnetic memory element and driving method thereof of this invention is capable of multivalue recording with good controllability using unipolar electric pulses the pulse height of which is changed, and is not only capable of 4 $F^2$ comprising one diode and 1 MTJ, but can also achieve higher densities. As a result, a high-performance, highly integrated nonvolatile storage device can be realized at low cost.

EXPLANATION OF REFERENCE NUMERALS

Figure 1:
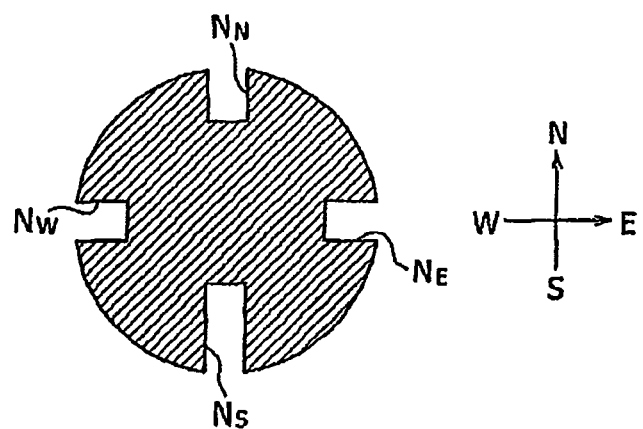
FIG. 1 schematically shows a spin valve structure of this invention with a plurality of (four) notches, including a notch of different shape, provided on the outer periphery.

1 Substrate
2 Bottom electrode (Cu/Ta)
3 Pinning layer (CoFeB/Ru/CoFe/PtMn)
4 Nonmagnetic layer (MgO tunnel barrier film)
5 Free layer (CoFeB)
6 Nonmagnetic layer (Pt)
7 Magnetic change layer (GdFeCo)
8 Interlayer insulating film ($SiO_2$)
9 Top electrode (Cu/Ta)
10 Memory cell
11 Rectifying element

DETAILED DESCRIPTION

First Embodiment

As an embodiment of this invention, a spin valve element and a method of driving such an element of this invention are explained based on FIG. 1 to FIG. 4.

The current-induced magnetization switching method is a method which causes reversal of the magnetization of a free layer 5 using the polarity of a current. An operation to cause the magnetizations in the free layer 5 and pinning layer 3 to be parallel is realized by passing current from the free layer side 5, that is, injecting spin-polarized electrons from the pinning layer side 3, through the nonmagnetic layer 4, into the free layer 5. On the other hand, to make the magnetizations antiparallel, current is passed from the pinning layer side 3, that is, spin-polarized electrons are injected from the free layer side 5, through the nonmagnetic layer 4, into the pinning layer 3. At this time, it is thought that only electrons parallel to the pinning layer 3 pass through, and electrons having a spin other than parallel are reflected and accumulate in the free layer 5, so that consequently the free layer magnetization is arranged to be antiparallel to that of the pinning layer 3. That is, the current-induced magnetization switching method is a method of injecting electrons such that angular momentum including localized spin is preserved.

On the other hand, the spin angular momentum of the pinning layer 3 can independently cause rotation of the magnetization of the free layer 5; this is called the spin precession method. When this method is used, electric pulses may be unipolar, and so a rectifying element 11 rather than a transistor can be used as the selection switch which is necessary when forming a magnetic memory element. Hence crosspoint type memory with a cell size of 4 $F^2$, which is in principle the smallest possible area, can be realized. And if multivalue recording can be realized, then the equivalent of high densities in excess of 4 $F^2$ become possible.

These inventors discovered that recording of multiple values is possible using a spin precession method. This operation is explained using a spin valve structure in which a plurality of cutouts, including one cutout with a different shape, are provided in the peripheral portion. Here an explanation is given using a spin valve structure having substantially a circular in-plane shape, and with four rectangular cutouts $N_S$, $N_E$, $N_N$, $N_W$ provided, as shown in FIG. 1.

A case is explained in which the shapes of the cutouts $N_S$, $N_E$, $N_N$, $N_W$ are rectangular, and four cutouts are formed in the peripheral portion at 90° intervals. Here, in order to specify cutouts, symbols for east, west, south and north (abbreviated to E, W, S, N, in order) are introduced. As shown in FIG. 1, only the cutout $N_S$ at the S position is made long. The spin valve element has a diameter of 100 nm and thickness of 20 nm, and the cutout dimensions are width 12.5 nm, and a length at the S position only of 28 nm, while the length of the other cutouts is 25 nm.

Figure 2:
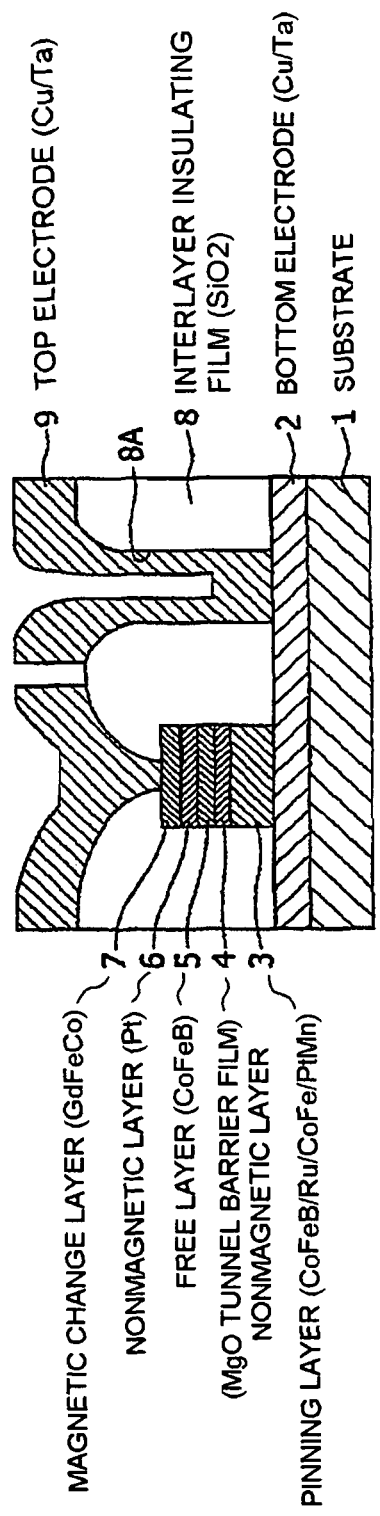
FIG. 2 is a cross-sectional view of a magnetic memory element of this invention.

FIG. 2 is a cross-sectional view of a magnetic memory element including the above spin valve structure (cutouts are omitted). On a substrate 1 are formed in order a bottom electrode 2 (Cu/Ta), pinning layer 3 (CoFeB/Ru/CoFe/PtMn), tunnel barrier film 4 (MgO) as a nonmagnetic layer, free layer 5 (CoFeB), nonmagnetic metal layer 6 (Pt), and magnetic change layer 7 (GdFeCo). And, Ar ion milling or another method is used to form the junction size to a diameter of 100 nm, and at this time the above-described cutouts are formed in the peripheral portion. After forming an interlayer insulating film 8 (SiO$_2$), a top electrode 9 (Cu/Ta) is formed through a contact hole 8A in the junction portion and bottom electrode 2. At this time, the magnetization direction in the pinning layer 3 is orthogonal to the cutout with the different shape, that is, in the east-west direction; here it is assumed that this direction is from west (W) towards east (E). The orientation of the magnetization of the magnetic change layer 7 is the south-north direction, oriented from south (S) towards north (N). Such a magnetization orientation is realized by a method of first applying a magnetic field in the magnetization direction of the pinning layer 3 and performing annealing, after which the magnetic field is reduced and the direction in the magnetic change layer 7 is made uniform. This is because unlike the pinning layer 3, the magnetization of the magnetic change layer 7 is not pinned.

Figure 3:
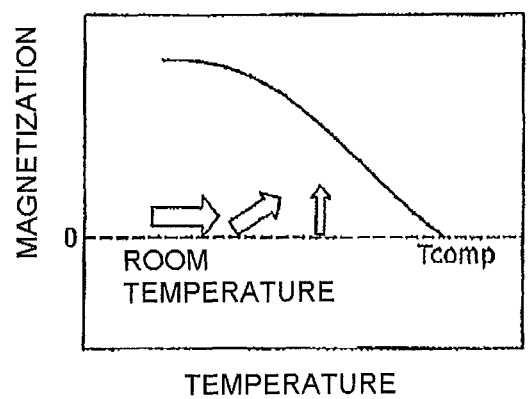
FIG. 3 schematically shows the relation between magnetization (magnitude and orientation) and temperature of GdFeCo used in the magnetic change layer of a magnetic memory element of this invention.
Figure 4:
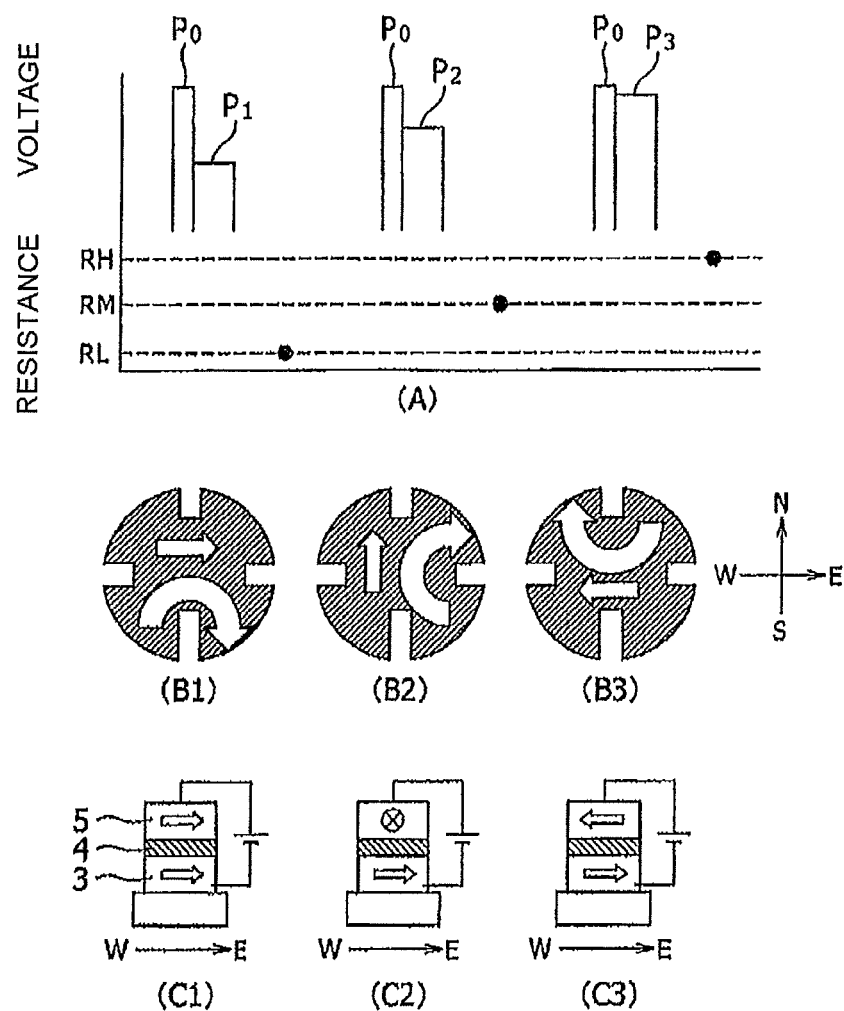
FIG. 4 shows the resistance values (RL, RM, RH) and change in rotational magnetization of the free layer, and the relative relation between the pinning layer and free layer in the spin valve structure, due to application of electric pulses in a method of driving a magnetic memory element of this invention.

FIG. 3 shows magnetic characteristics of GdFeCo used in the magnetic change layer 7. As the magnetization decreases with rising temperature, the magnetization direction changes from in-plane to oblique, and finally to the perpendicular direction. This is because Gd has the largest magnetic moment among the rare earth elements and has a large demagnetizing field, and the magnetization is within the plane until the total magnetization becomes small near the Curie temperature ($T_a$), and because, due to the occurrence of a perpendicular magnetization component with rising temperature, the magnetization direction consequently becomes oblique to the film plane when the temperature rises. In order to raise the temperature of the magnetic change layer 7, the electric pulses used for spin-injection magnetization reversal are utilized without modification. When electric pulses are applied to a minute junction used in spin-injection magnetization reversal, a rise in temperature occurs due to the current heating in the minute region, and this is utilized as a heat source. Hence there is no need to provide wiring separately from that for magnetic field generation, and so there is no impediment to increasing density. While depending on the element structure, it is known that in general the rates of temperature increases and cooling in such minute junctions can be of nanosecond or shorter, and so element operation speeds are not affected by these processes.

Next, the method of driving a magnetic memory element of this embodiment is explained. FIG. 4A shows unipolar electric pulses $P_0P_1$, $P_0P_2$, $P_0P_3$ formed from two or more pulses in a driving method of this invention, and resistance values (RL, RM, RH) upon reading after application of these electric pulses; FIGS. 4B1 to 4B3 are schematic diagrams of magnetization patterns formed in the free layer 5 by electric pulse application; and FIGS. 4C1 to 4C3 show magnetization directions in the free layer 5 relative to the pinning layer in the spin valve structure.

As shown in FIG. 4A, unipolar electric pulses are used so that driving is possible even when diodes are series-connected as selection elements. The first pulse $P_0$ in each of the pulse series shown in FIG. 4A is to cause magnetization rotation (precession) in the free layer 5. During this pulse application the temperature of the magnetic change layer 7 rises, and the magnetization direction changes from a direction in the film plane to an oblique direction. By this means, spin is injected from the pinning layer 3 into the free layer 5, and simultaneously a magnetic field with S→N orientation within the plane and also having a component in the perpendicular direction is applied from the magnetic change layer 7. As a result, a spiral-shape magnetization (vortex) is induced in the free layer 5, and no matter what the magnetization pattern in the free layer 5 at the time of pulse application is, initialization is once performed to a state in which rotation (precession) is continued. And, the magnetization pattern of the free layer 5 is switched according to the height of the pulse which follows. The magnetization patterns which occur after applying the pulses $P_1$ to $P_3$ in FIG. 4A are shown in FIGS. 4B1 to 4B3 respectively. In this way, when the vortex-shape rotational magnetization pattern is specified by the position of the vortex, the voltage (current) value required for the second pulse changes in order when the vortex is centered on the cutout in the S position (FIG. 4B1), when the vortex is centered on the cutout in the E position (FIG. 4B2), and when the vortex is centered on the cutout in the N position (FIG. 4B3). In this way, in this embodiment of the invention a method is realized which, although a so-called spin precession method, enables switching not by the pulse widths of electric pulses, but by the pulse heights. Controlling recording pulses corresponding to the spin precession period is not easy, due to different types of variation; but control of pulse heights (voltage values or current values) is comparatively easy, and information recording free of switching errors is possible. In this invention, a memory holding operation temperature range refers to the range of temperatures of the magnetic change layer 7 when being used to record information by the spin valve element at a temperature lower than the temperature of the magnetic change layer 7 when a pulse $P_0$ is applied and a write operation is performed, among the temperatures which can be exhibited by the magnetic change layer 7. Hence even when for example a rise in the temperature of the magnetic change layer 7 is observed due to a current passed to perform reading, so long as this temperature is lower than the temperature when performing a write operation, and the memory remains held, this temperature is within the memory holding operation temperature range.

The magnetization patterns in this free layer 5 are, in order in FIGS. 4B1 to 4B3, parallel to the pinning layer, perpendicular, and antiparallel, so that the resistance values read out as the tunnel magnetoresistance are RL (low), RM (middle), and RH (high), and so it is seen that three-value (multivalue) recording is possible.

Further, because a driving method of this invention always accompanies an initialization mode, even in the case of multivalue recording there is no need for a procedure to first read out the recorded state and then modify the recording pulse, and there is the advantage that reading can be performed rapidly.

As explained above, by means of a magnetic memory element and driving method for such an element of this invention, multivalue recording can be performed using the pulse heights of unipolar electric pulses. The materials and method of formation indicated as an example of the configuration of an element of this invention, illustrated in this embodiment, are not limited to those of the above embodiment.

Second Embodiment

Figure 5:
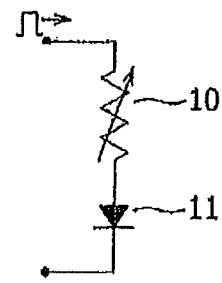
FIG. 5 schematically shows a magnetic memory element and rectifying element, forming a crosspoint type memory array which is an example of a nonvolatile storage device of this invention.
Figure 6:
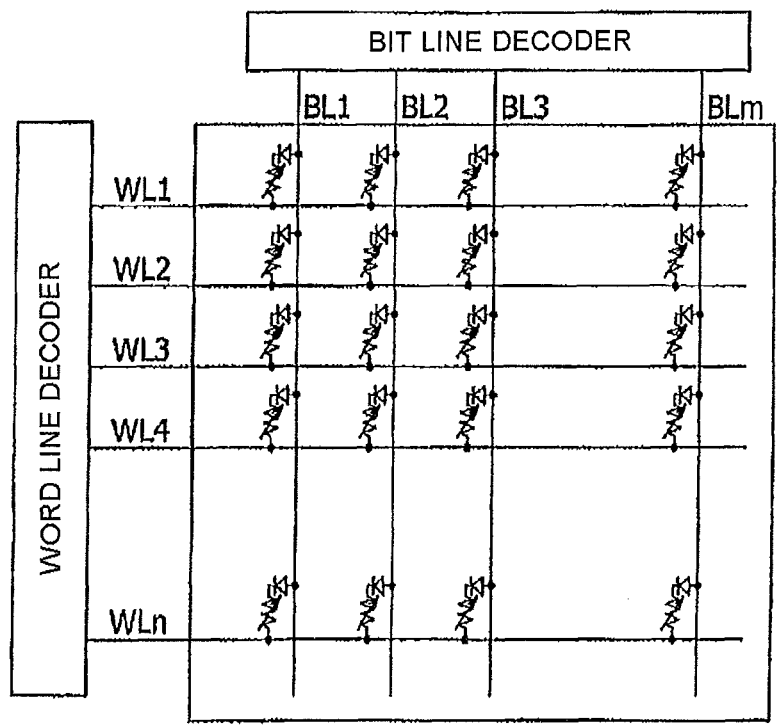
FIG. 6 schematically shows a crosspoint type memory array which is an example of a nonvolatile storage device of this invention.

Next, an example of the configuration of a nonvolatile storage device (a device of this invention), using an element of this invention as a memory cell 10, is explained using FIG. 5 and FIG. 6.

FIG. 5 schematically shows, using a variable resistance 10, a magnetic memory element forming a crosspoint type memory cell array which is one example of a nonvolatile storage device of this invention. As already explained, by means of a magnetic memory element and a method of driving such an element of this invention, switching using unipolar electric pulses is possible. As the element selection switch, a rectifying element 11 (here using a diode as an example) is connected in series, and by forming top electrodes 9 and bottom electrodes 2 in an array, a crosspoint type memory is formed. FIG. 6 shows the configuration of a nonvolatile storage device configured in this way. For example, diodes can be formed in advance on a Si substrate, and magnetic memory elements of this invention can be formed on the upper portions thereof. By applying positive-polarity electric pulses from the free layer side 5, switching can be performed efficiently.

Further, the process temperature necessary for fabrication of a magnetic memory element of this invention is an annealing temperature of approximately 350° C. or lower, so that there is no detriment to the performance of the transistors for electric pulse supply formed in the lower portion or the diodes formed for cell selection switching. Further, in order that the wiring withstand the above annealing temperature, this combination can be layered in three dimensions and the memory capacity increased.

In the above, embodiments of this invention have been described; but the invention is not limited to the above-described embodiments, and various modifications, alterations, and combinations are possible based on the technical concept of the invention.

The invention claimed is:

1. A magnetic memory element, comprising:
a spin valve structure having a substantially circular periphery except for a plurality of cutouts extending inward from the periphery, the spin valve structure including a free layer, a pinning layer, and a first nonmagnetic layer that is disposed between the free layer and the pinning layer;
a second nonmagnetic layer, arranged so that the free layer is disposed between the first and second nonmagnetic layers; and
a magnetic change layer that is disposed on the second nonmagnetic layer, and having magnetic characteristics which change according to temperature;
wherein one of the cutouts has a shape that is different from the shape of at least one other of the cutouts.

2. The magnetic memory element according to claim 1, wherein said one of the cutouts extends along an inward path toward a center of the magnetic memory element, and wherein an orientation of magnetization of the pinning layer is orthogonal to the inward path of said one of the cutouts.

3. The magnetic memory element according to claim 2, wherein the magnetic change layer comprises an amorphous rare earth-transition metal alloy thin film.

4. The magnetic memory element according to claim 3, wherein at a certain temperature, the magnetic change layer exhibits magnetization oriented in a film plane and along the direction of extension of the cutout with a different shape, and wherein a component perpendicular to the film plane appears in the magnetization by raising the temperature from the certain temperature.

5. The magnetic memory element according to claim 3, characterized in that the magnetic change layer is an N-type ferrimagnet having a magnetic compensation temperature $T_{comp}$ in a memory holding operation temperature range of the magnetic memory element.

6. A method of driving a the magnetic memory element according to claim 1, comprising the step of recording information by applying at least one unipolar electric pulse to the magnetic memory element.

7. The method of according to claim 6, wherein the at least one unipolar electric pulse includes two or more pulses of different heights, and different information is recorded by changing the height of the second pulse.

8. The method according to claim 7, wherein regardless of a recording state of the magnetic memory element, recorded multivalue information and types of unipolar electric pulses to record the multivalue information are in a one-to-one correspondence.

9. A nonvolatile storage device, comprising:
the magnetic memory element according to claim 1;
a rectifying element connected in series to the magnetic memory element;
information rewrite means for generating a unipolar electric pulse to drive the magnetic memory element; and
means for reading stored information from a current quantity flowing through the magnetic memory element.

10. A method of driving the magnetic memory element according to claim 2, comprising the step of recording information by applying at least one unipolar electric pulse to the magnetic memory element.

11. The method according to claim 10, wherein the at least one unipolar electric pulse comprises two or more pulses of different heights, and different information is recorded by changing the height of the second pulse.

12. The method according to claim 11, wherein regardless of a recording state of the magnetic memory element, recorded multivalue information and types of unipolar electric pulses to record the multivalue information are in a one-to-one correspondence.

13. A nonvolatile storage device, comprising:
the magnetic memory element according to claim 2;
a rectifying element connected in series to the magnetic memory element;
information rewrite means for generating a unipolar electric pulse to drive the magnetic memory element; and
means for reading stored information from a current quantity flowing through the magnetic memory element.

14. A method of driving the magnetic memory element according to claim 3, comprising the step of recording information by applying at least one unipolar electric pulse to the magnetic memory element.

15. The method according to claim 14, wherein the at least one unipolar electric pulse comprises two or more pulses of different heights, and different information is recorded by changing the height of the second pulse.

16. A nonvolatile storage device, comprising:
the magnetic memory element according to claim 3;
a rectifying element connected in series to the magnetic memory element;
information rewrite means for generating a unipolar electric pulse to drive the magnetic memory element; and
means for reading stored information from a current quantity flowing through the magnetic memory element.

17. A method of driving the magnetic memory element according to claim 4, comprising the step of recording information by applying at least one unipolar electric pulse to the magnetic memory element.

18. A nonvolatile storage device, comprising:
the magnetic memory element according to claim 4;
a rectifying element connected in series to the magnetic memory element;

information rewrite means for generating a unipolar electric pulse to drive the magnetic memory element; and
means for reading stored information from a current quantity flowing through the magnetic memory element.

19. A method of driving the magnetic memory element according to claim 5, comprising the step of recording information by applying at least one unipolar electric pulse to the magnetic memory element.

20. A nonvolatile storage device, comprising:
the magnetic memory element according to claim 5;
a rectifying element connected in series to the magnetic memory element;
information rewrite means for generating a unipolar electric pulse to drive the magnetic memory element; and
means for reading stored information from a current quantity flowing through the magnetic memory element.

* * * * *